United States Patent [19]
Lee

[11] Patent Number: 5,891,789
[45] Date of Patent: Apr. 6, 1999

[54] METHOD FOR FABRICATING ISOLATION LAYER IN SEMICONDUCTOR DEVICE

[75] Inventor: Sang-Don Lee, Chungcheongbuk-do, Rep. of Korea

[73] Assignee: LG Semicon Co., Ltd., Chungcheongbuk-do, Rep. of Korea

[21] Appl. No.: 812,137

[22] Filed: Mar. 5, 1997

[30] Foreign Application Priority Data

May 3, 1996 [KR] Rep. of Korea .................. 1996-14402

[51] Int. Cl.$^6$ ................................................. H01L 21/76
[52] U.S. Cl. ......................... 438/439; 438/775; 438/448
[58] Field of Search ................................... 438/448, 439, 438/775, 229

[56] References Cited

U.S. PATENT DOCUMENTS 5,260,229  11/1993  Hodges et al. .

FOREIGN PATENT DOCUMENTS 1-187950  7/1989  Japan .

OTHER PUBLICATIONS

*A Poly–Buffer Recesed LOCOS Process for 256Mbit DRAM Cells*, by N. Shimizu et al, 1992 IEDM, pp. 10.6.1–10.6.4.

*Primary Examiner*—George Fourson

[57] ABSTRACT

A method for fabricating an isolation layer in a semiconductor device, includes the steps of forming a pad oxide layer on a substrate and sequentially forming a first thin nitride layer, a polysilicon layer and a second nitride layer on the pad oxide layer; selectively and sequentially dry-etching the second nitride layer, polysilicon layer, first nitride layer and pad oxide layer to expose a portion of the substrate corresponding to a field region and to form an active region pattern; growing an oxide layer on the exposed portion of the substrate in the field region; carrying out nitridation onto the polysilicon layer to form a nitride layer on the side of the active region pattern; and performing field oxidation to form a field oxide layer in the field region.

13 Claims, 5 Drawing Sheets

METHOD FOR FABRICATING ISOLATION LAYER IN SEMICONDUCTOR DEVICE

BACKGROUND OF THE INVENTION

The present invention relates to a method for fabricating a semiconductor device and more particularly, to a method for fabricating an isolation layer in a semiconductor device.

In fabricating a semiconductor device, a plurality of elements formed on a semiconductor wafer must be isolated from each other. As one of the methods for isolating the elements from each other, the local oxidation of silicon (LOCOS) process is widely known and used.

Among the different LOGOS processes, the poly-buffer-recessed (PBR) LOCOS process will be explained below with reference to FIGS. 1A, 1B and 1C.

Referring to FIG. 1A, a pad oxide layer 11 is formed on a semiconductor substrate 10, and a polysilicon layer 12 and a CVD (chemical vapor deposition) nitride layer 13 are sequentially formed thereon. Then the CVD nitride layer 13, polysilicon layer 12 and pad oxide layer 11, which are placed on a field region of the substrate 10, are sequentially dry-etched using a LOCOS mask. The LOCOS mask defines a portion of the substrate on which a LOCOS oxide layer is to be formed. The surface of the substrate 10 exposed by dry etching may be further etched. However, it is possible to omit the further etching of the substrate 10.

Referring to FIG. 1B, a thin oxide layer 14 is formed on the exposed field region. Then a CVD (chemical vapor deposition) nitride layer is formed and etched back to form a nitride layer 15 on the side of the oxide layer 14. Here, the thin oxide layer 14 is formed according to the natural oxidation or thermal oxidation of the exposed portion of the substrate 10 and polysilicon layer 12.

When the nitride layer 15 is formed with etch back, the portion of the nitride layer 15 formed on the substrate of the field region is removed, and the portion of the nitride layer 15 formed on the side of the pad oxide layer 11 and polysilicon layer 12 is maintained, thereby forming the (sidewall) nitride layer 15. Then, a field oxidation is carried out to form a field oxide layer 16 as shown in FIG. 1C. Thereafter, the nitride layers 13 and 15, polysilicon layer 12 and pad oxide layer 11 are removed so that only the field oxide layer 16 remains on the substrate 10.

The aforementioned conventional LOCOS process, however, requires the sidewall nitride layer 15 to be deposited through CVD (chemical vapor deposition) and etched back by dry etching. During dry etching of the nitride layer 15 the oxide layer 14 is etched unintentionally since the oxide layer 14 is relatively thin. In some instances, even the substrate 10 may be etched unintentionally. Therefore, the conventional LOCOS process requires accurate control of etch rate of the nitride layer 15 which is difficult to obtain. Consequently, the conventional process for forming the sidewall nitride layer is complicated.

Furthermore, after the formation of the sidewall nitride layer 15, the nitride layer obtains a gentle slope. In case that the field region is defined by the size less than 0.3 μm, a sufficient space in which the field oxide layer is to be formed cannot be secured. But, even if the sufficient space is secured, a large bird's beak is formed in the remaining space which results in an insufficient space for isolating the semiconductor elements from one another.

SUMMARY OF THE INVENTION

It is an object of the present invention to provide a method for fabricating an isolation layer in a semiconductor device, in which field and active regions are patterned using a LOCOS mask, and a nitride layer is easily formed on the side of the active region using thermal nitridation process to simplify the process and avoid forming bird's beaks on the field regions, whereby the disadvantages and problems of the conventional LOCOS process are overcome.

To accomplish the above and other objects of the present invention, there is provided a method for fabricating an isolation layer in a semiconductor device, including the steps of: forming a first buffer layer on a substrate, a first oxidation-resist layer on the first buffer layer, a second buffer layer on the first oxidation-resist layer, and the second oxidation-resist layer on the second buffer layer; selectively etching the first buffer layer, the first oxidation-resist layer, the second buffer layer, and the second oxidation-resist layer to expose a portion of the substrate corresponding to the field region; forming an insulating layer on the portion of the substrate corresponding to the field region; forming a third oxidation-resist layer on exposed sidewalls of the second buffer layer; and forming a field insulating layer on the field region.

The buffer layer is a silicon oxide layer (polysilicon layer). The oxidation-resist layer is a silicon nitride layer formed by a nitridation process using a high temperature nitridation, in which the polysilicon layer exposed on the side of the active field pattern is nitrized under the ambient of $NH_3$ gas at a temperature of 900° C. to 1300° C.

To achieve the objects of the present invention, there is further provided a method for fabricating an isolation layer in a semiconductor device, including the steps of: forming a first buffer layer on a substrate, a first oxidation-resist layer on the first buffer layer, and a second buffer layer on the first oxidation-resist layer; selectively etching the first buffer layer, the first oxidation-resist layer, and the second buffer layer to expose a portion of the substrate corresponding to a field region; forming an insulating layer on the portion of the substrate corresponding to the field region; forming a second oxidation-resist layer on the exposed surface of the second buffer layer, the exposed surface including an upper surface and sidewalls; and forming a field insulating layer in the field region. Herein, the buffer layers may be oxide layers (polysilicon layers) and the oxidation-resist layers may be nitride layers.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

The novel features believed characteristic of the invention, as well as other features and advantages thereof, will best be understood by reference to the following detailed description of a particular embodiment, read in conjunction with the accompanying drawings, wherein.

DETAILED DESCRIPTION OF PREFERRED EMBODIMENTS

Preferred embodiments of the present invention will be explained below with reference to the accompanying drawings. FIGS. 2A to 2D are cross-sectional views showing a LOCOS process according to a first embodiment of the present invention.

Figure 1A:
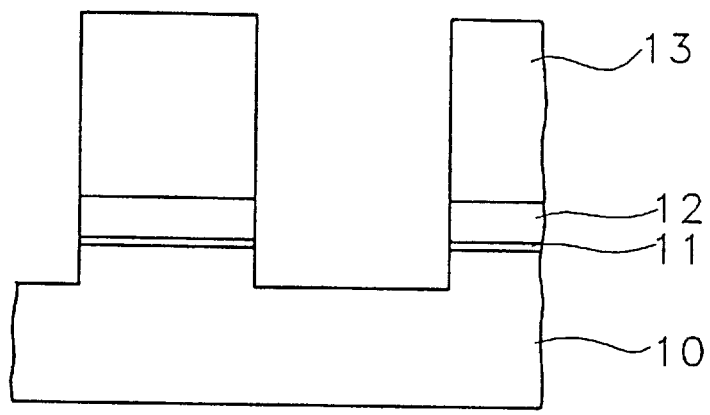
FIGS. 1A to 1C are cross-sectional views for explaining a conventional LOCOS process.
Figure 1B:
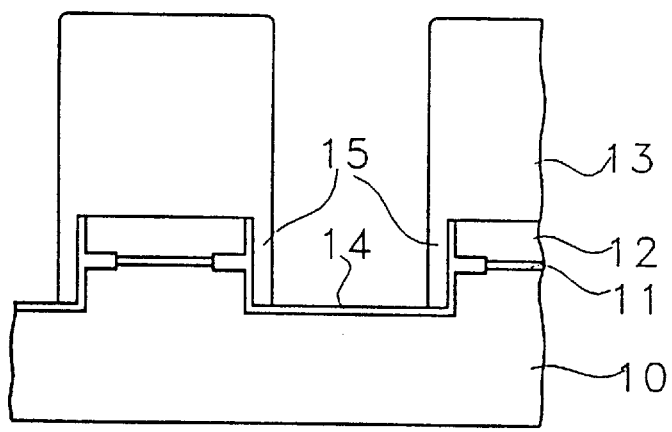
Figure 1C:
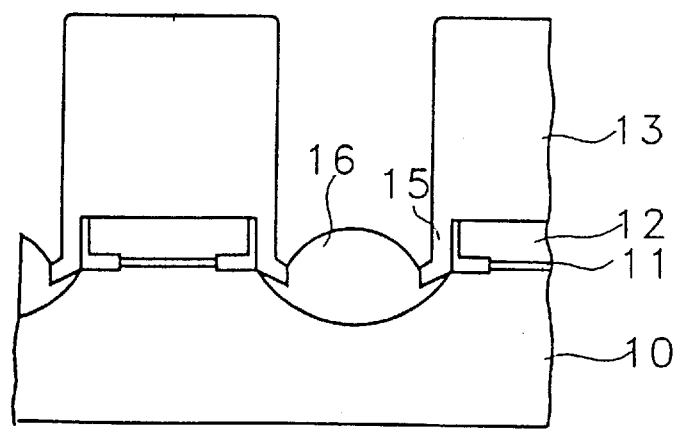
Figure 2A:
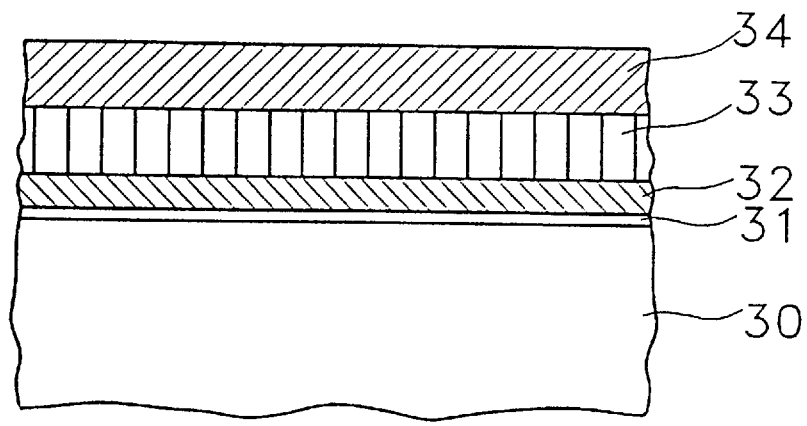
FIGS. 2A to 2D are cross-sectional views for explaining a LOCOS process according to a first =embodiment of the present invention.

Referring to FIG. 2A, a pad oxide layer 31 (first buffer layer) is formed on a substrate 30. A thin first CVD nitride layer 32 (first oxidation-resist layer), a polysilicon layer 33 (second buffer layer) and a second CVD nitride layer 34 (second oxidation-resist layer) are sequentially formed on the pad oxide layer 31. The first and second nitride layers 32 and 34 are non-oxidizable layers. Here, for example, the pad oxide layer 31 has a thickness of 50 to 1000 Å, the first nitride layer 32 has a thickness of 100 to 1000 Å, the polysilicon layer 33 has a thickness of 100 to 5000 Å, and the second nitride layer 34 has a thickness of 100 to 2000 Å.

Figure 2B:
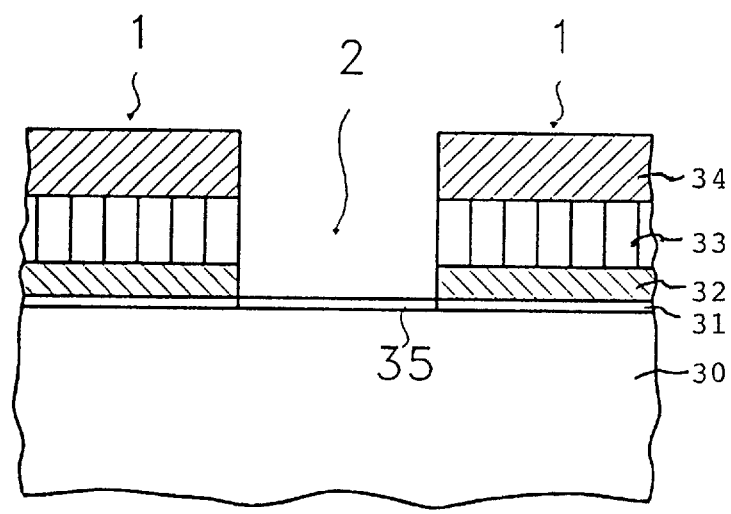

Referring to FIG. 2B, the second CVD nitride layer 34, polysilicon layer 33, first CVD nitride layer 32 and pad oxide layer 31 are selectively dry-etched through photolithography using a LOCOS mask for defining active and field regions, to form an active pattern 1 and a field region 2. Then a thin oxide layer 35 (insulating layer) is formed on the exposed surface of the substrate 30 corresponding to the field region 2. The thin oxide layer 35 is formed with a thickness of 50 to 1000 Å. Here, it is possible that the exposed surface of the substrate 30 is etched to a depth of 1000 Å for forming the oxide layer 35 thereon.

Figure 2C:
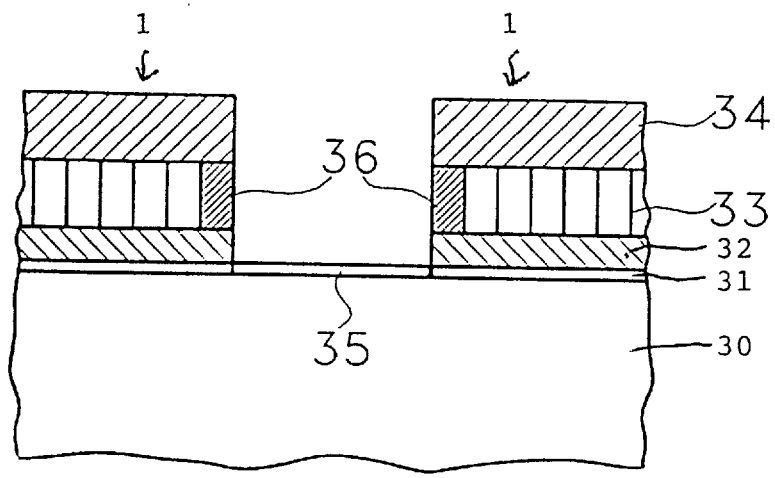

Referring to FIG. 2C, the polysilicon layer 33 exposed on the side of the active pattern 1 is nitrized under the ambient of $NH_3$ gas at a temperature of 900° to 1300° C. (high temperature nitridation process), thereby forming a nitride layer 36 (third oxidation-resist layer) on the side of the polysilicon layer 33. The nitride layer 36 is a non-oxidizable layer formed with a thickness of 50 to 500 Å. By doing so, the nitride layer 36 is formed on the side of active pattern 1.

During the high temperature nitridation process, a nitro group is introduced into the interface of the substrate 30 and pad oxide layer 32 on the active layer. This allows reduction in the size of the bird's beak formed during field oxidation.

Figure 2D:
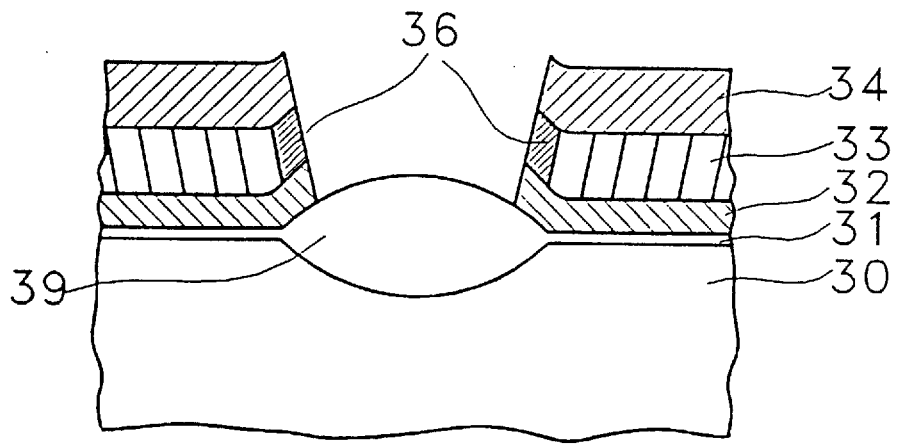

Referring to FIG. 2D, field oxidation is carried out on the thin oxide layer 35 to form a field oxide layer 39 (field insulating layer) and to complete the isolation (oxide) layer fabricating process. Thereafter, circuit elements are formed on the substrate having the isolation oxide layer according to a conventional process.

A second embodiment of the present invention will be explained below with reference to FIGS. 3A to 3D.

Figure 3A:
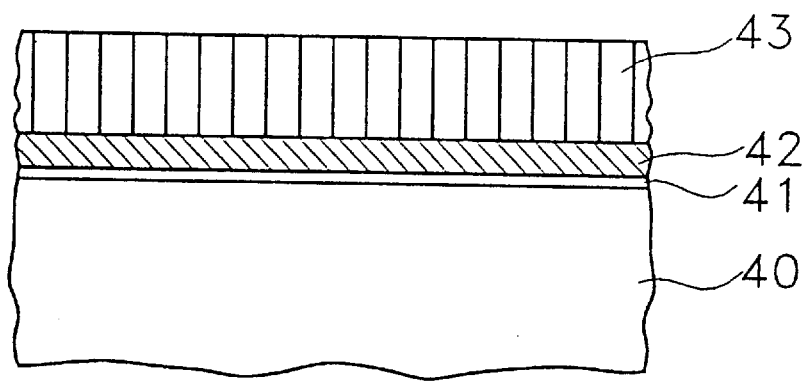
FIGS. 3A to 3D are cross-sectional views for explaining a LOCOS process according to a second embodiment of the present invention.

First of all, referring to FIG. 3A, a pad oxide layer 41 (first buffer layer) is formed on a substrate 40, and a thin CVD nitride layer 42 (first oxidation-resist layer) and a polysilicon layer 43 (second buffer layer) are sequentially formed on the pad oxide layer 41. Here, for example, the pad oxide layer 41 has a thickness of 50 to 1000 Å, the nitride layer 42 has a thickness of 100 to 1000 Å, and the polysilicon layer 43 has a thickness of 100 to 5000 Å.

Figure 3B:
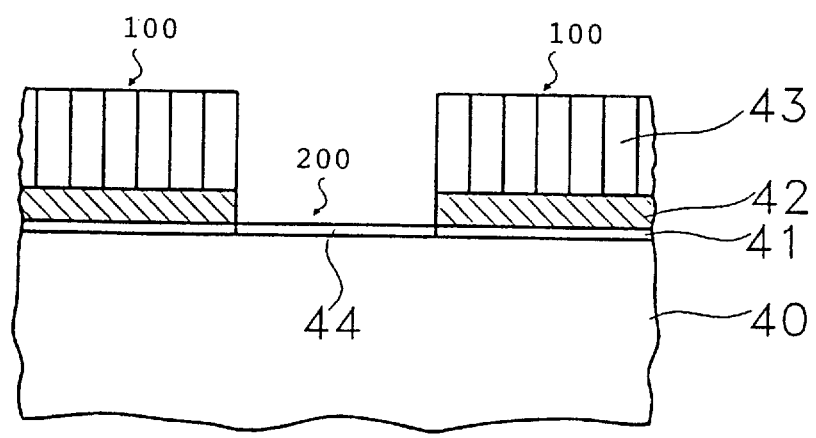

Referring to FIG. 3B, the polysilicon layer 43, CVD nitride layer 42 and pad oxide layer 41 are selectively dry-etched through photolithography using a LOCOS mask, thereby defining an active pattern 100 and a field region 200. Here, the exposed portion of substrate 40 corresponding to the field region 200 can be further etched to a depth of 1000 Å. Then, a thin oxide layer 44 (insulating layer) is formed on the exposed surface portion of the substrate 40 corresponding to the field region 200. The thin oxide layer 44 is formed with a thickness of 50 to 1000 Å.

Figure 3C:
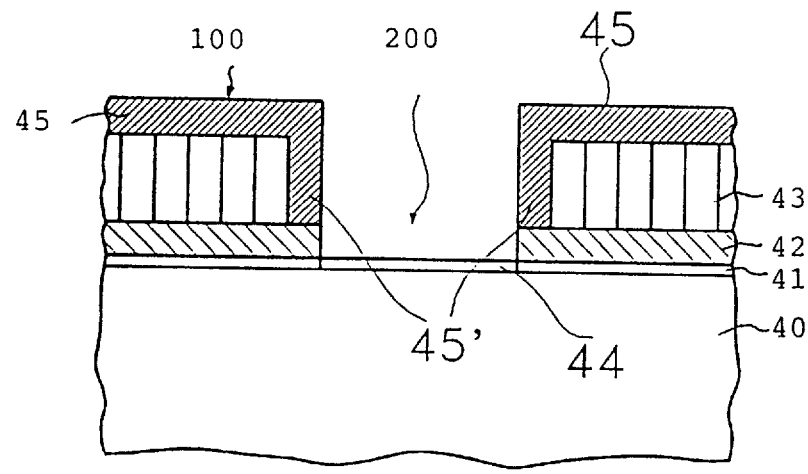

Referring to FIG. 3C, a high temperature nitridation process is carried out under the ambient of $NH_3$ gas at a temperature of 900° to 1300° C. to incorporate nitrogen into the polysilicon layer 43 exposed on the side of the active pattern 100. This forms a nitride layer 45 (third oxidation-resist layer) on the surface of the polysilicon layer 43. Here, for example, the nitride layer 45 has a thickness of 50 to 500 Å. By doing so, a nitride layer sidewall 45' is also formed on each side of the active pattern 100. During the high temperature nitridation process, a nitro group is introduced into the interface of the substrate 40 and pad oxide layer 41 on the active layer. This allows the size of the bird's beak to be reduced during field oxidation (which is to follow). The nitride layers 42 and 45 are non-oxidizable layers.

Figure 3D:
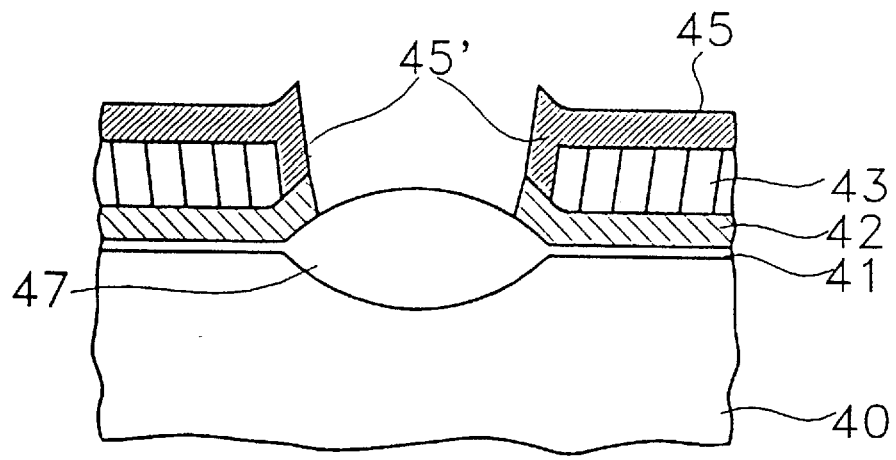

Referring to FIG. 3D, field oxidation is carried out on the thin oxide layer 44 to form a field insulating layer 47 and to complete the isolation (oxide) layer fabricating process. In the second embodiment of the present invention, the second CVD (chemical vapor deposition) nitride layer is not formed (or etched) on the polysilicon layer 43, which differs from the first embodiment of the present invention. Accordingly, the process is even more simplified.

According to the present invention, the nitride layer sidewall is easily formed using the thermal nitridation process, instead of the complicated conventional process. Also, since the polysilicon layer is surrounded by the thin nitride layers (e.g., in the first embodiment), it is possible to prevent the polysilicon layer from being oxidized, which occurs in PBL (Poly Buffered LOCOS) process.

Furthermore, during the formation of the nitride layer on the side of the polysilicon layer, less stress is applied to the active region using the nitridation process than using the conventional LOCOS process. At the same time, the nitridation process introduces a nitro group into the interface of the substrate and the pad oxide layer which help reduce the size of the bird's beak.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A method for fabricating an isolation layer in a semiconductor device, comprising the steps of:

forming a first buffer layer, a first oxidation-resist layer, and a second buffer layer on a substrate to define a field region;

forming an oxide layer on a portion of the substrate corresponding to the field region;

forming a third oxidation-resist layer on an exposed surface of the second buffer layer by a nitridation process; and forming a field insulating layer on the substrate using the oxide layer;

wherein the exposed surface of the second buffer layer includes an upper surface and sidewalls of the second buffer layer.

2. The method for fabricating an isolation layer in a semiconductor device, as claimed in claim 1, wherein said step of forming the first buffer layer further includes the steps of:

forming a second oxidation-resist layer on the second buffer layer, and selectively removing the second oxidation-resist layer to define the field region.

3. The method for fabricating an isolation layer in a semiconductor device, as claimed in claim 2, wherein the thickness of the second oxidation-resist layer is approximately 100 to 2000 Å.

4. The method for fabricating an isolation layer in a semiconductor device as claimed in claim 1, wherein the nitridation process is performed on the exposed surface of the second buffer layer under an ambient of $NH_3$ gas at a temperature of approximately 900° to 1300° C.

5. The method for fabricating an isolation layer in a semiconductor device as claimed in claim 1, wherein the thickness of the third oxidation-resist layer is approximately 50 to 500 Å.

6. The method for fabricating an isolation layer in a semiconductor device as claimed in claim 1, wherein the first buffer layer has a thickness of approximately 50 to 1000 Å, the first oxidation-resist layer has a thickness of approximately 100 to 1000 Å, and the second buffer layer has a thickness of approximately 100 to 5000 Å.

7. The method for fabricating an isolation layer in a semiconductor device as claimed in claim 8, wherein the layer is formed with a thickness of approximately 50 to 1000 Å.

8. The method for fabricating an isolation layer in a semiconductor device as claimed in claim 1, wherein said step of forming the first buffer layer includes the steps of:
    depositing a first buffer material, a first oxidation-resist material, and a second buffer material on the substrate, and
    selectively removing the first buffer material, the first oxidation-resist material and the second buffer material to form the first buffer layer, the first oxidation-resist layer, and the second layer, respectively.

9. The method for fabricating an isolation layer in a semiconductor device as claimed in claim 1, wherein said step of forming the field insulating layer includes the step of:
    performing field oxidation on the oxide layer formed on the substrate to form the field insulating layer.

10. The method for fabricating an isolation layer in a semiconductor device as claimed in claim 8, wherein said step of selectively removing includes the step of:
    selectively dry-etching the second buffer material, the first oxidation-resist material and the first buffer material.

11. A method for fabricating an isolation layer in a semiconductor device, comprising the steps of:
    forming a first buffer layer, a first oxidation-resist layer, and a second buffer layer on a substrate to define a field region;
    forming an insulation layer on a portion of the substrate corresponding to the field region;
    forming a third oxidation-resist layer on an exposed surface of the second buffer layer by a nitridation process, wherein the exposed surface of the second buffer includes an upper surface of the second buffer layer; and
    forming a field insulating layer on the substrate in the field region.

12. The method for fabricating an isolation layer in a semiconductor device, as claimed in claim 11, wherein said step of forming the field insulating layer includes the step of:
    performing field oxidation on the insulation layer formed on the substrate to form the field insulating layer.

13. The method for fabricating an isolation layer in a semiconductor device as claimed in claim 12, wherein the exposed surface of the second buffer further includes sidewalls of the second buffer layer.

* * * * *